US012513822B2

(12) United States Patent
Sugihara

(10) Patent No.: US 12,513,822 B2
(45) Date of Patent: Dec. 30, 2025

(54) ELECTRONIC CONTROL MODULE

(71) Applicant: NISSAN MOTOR CO., LTD., Yokohama (JP)

(72) Inventor: Hironobu Sugihara, Kanagawa (JP)

(73) Assignee: NISSAN MOTOR CO., LTD., Yokohama (JP)

( * ) Notice: Subject to any disclaimer, the term of this patent is extended or adjusted under 35 U.S.C. 154(b) by 454 days.

(21) Appl. No.: 17/919,863

(22) PCT Filed: Apr. 24, 2020

(86) PCT No.: PCT/IB2020/000405
§ 371 (c)(1),
(2) Date: Feb. 21, 2023

(87) PCT Pub. No.: WO2021/214504
PCT Pub. Date: Oct. 28, 2021

(65) Prior Publication Data
US 2023/0247764 A1 Aug. 3, 2023

(51) Int. Cl.
*H05K 1/14* (2006.01)
*H05K 1/02* (2006.01)
*H05K 1/18* (2006.01)

(52) U.S. Cl.
CPC ........... *H05K 1/144* (2013.01); *H05K 1/0203* (2013.01); *H05K 1/181* (2013.01); *H05K 2201/042* (2013.01)

(58) Field of Classification Search
CPC ...... H05K 1/144; H05K 1/0203; H05K 1/181; H05K 2201/042
See application file for complete search history.

(56) References Cited

U.S. PATENT DOCUMENTS

| 5,566,752 A | * | 10/1996 | Arnold | H01L 23/367 361/708 |
| 2005/0168941 A1 | * | 8/2005 | Sokol | H05K 7/20445 361/688 |
| 2005/0230820 A1 | * | 10/2005 | Licht | H01L 25/072 257/E23.104 |
| 2009/0086455 A1 | * | 4/2009 | Sakamoto | H05K 7/14322 29/830 |

(Continued)

FOREIGN PATENT DOCUMENTS

| CN | 2658940 Y | 11/2004 |
| CN | 101419965 A | 4/2009 |

(Continued)

OTHER PUBLICATIONS

Eishin Matsumoto et al., "Power Control Unit for Hybrid Vehicle," Keihin Technical Report, vol. 5, pp. 32-35, Dec. 26, 2016.

*Primary Examiner* — Mukundbhai G Patel
(74) *Attorney, Agent, or Firm* — Foley & Lardner LLP

(57) ABSTRACT

An electronic control module includes: a first board having an upper surface on which electronic components are mounted; a second board disposed on an upper surface side of the first board with an interval therebetween and having an upper surface on which electronic components are mounted; and a tubular bracket provided between the first board and the second board and defining a closed space between the first board and the second board.

4 Claims, 4 Drawing Sheets

(56) References Cited

U.S. PATENT DOCUMENTS

| | | |
|---|---|---|
| 2010/0232991 A1* | 9/2010 | Nakagami .............. H02K 11/33 |
| | | 417/410.5 |
| 2015/0078818 A1 | 3/2015 | Chitaka et al. |
| 2018/0242469 A1 | 8/2018 | Suzuki |
| 2021/0175145 A1 | 6/2021 | Teranishi et al. |

FOREIGN PATENT DOCUMENTS

| | | |
|---|---|---|
| CN | 102238842 A | 11/2011 |
| DE | 19925983 A1 | 12/2000 |
| JP | 2009-081327 A | 4/2009 |
| JP | 2018-136912 A | 8/2018 |
| JP | 2019-106432 A | 6/2019 |
| WO | WO-2016/012688 A1 | 1/2016 |

* cited by examiner

ELECTRONIC CONTROL MODULE

TECHNICAL FIELD

The present invention relates to an electronic control module.

BACKGROUND ART

An electronic control module in which boards are stacked is known in the related art. For example, EISHIN MATSUMOTO ET AL., POWER CONTROL UNIT FOR HYBRID VEHICLE, KEIHIN TECHNICAL REPORT, 2016.12.26, VOL. 5, P. 32-P. 35 discloses an electronic control module in which a gate driver board and an engine control unit (ECU), which controls a power control unit (PCU) that drives a motor, are stacked on a power module.

SUMMARY OF INVENTION

In the electronic control module disclosed in the above document, when the ECU is stacked on and fixed to the gate driver board, contamination may occur due to a screw or the like. When such contamination adheres to, for example, electronic components having a narrow interval between terminals disposed on the gate driver board, a short circuit failure may occur between the terminals.

The present invention has been made in view of the above problem, and an object of the present invention is to suppress adhesion of contamination on a board in an electronic control module in which boards are stacked.

According to the present invention, an electronic control module includes: a first board having an upper surface on which electronic components are mounted; a second board disposed on an upper surface side of the first board with an interval therebetween and having an upper surface on which electronic components are mounted; and a tubular bracket provided between the first board and the second board and defining a closed space between the first board and the second board.

DESCRIPTION OF EMBODIMENTS

Hereinafter, an embodiment of the present invention will be described with reference to the accompanying drawings.

Figure 1:
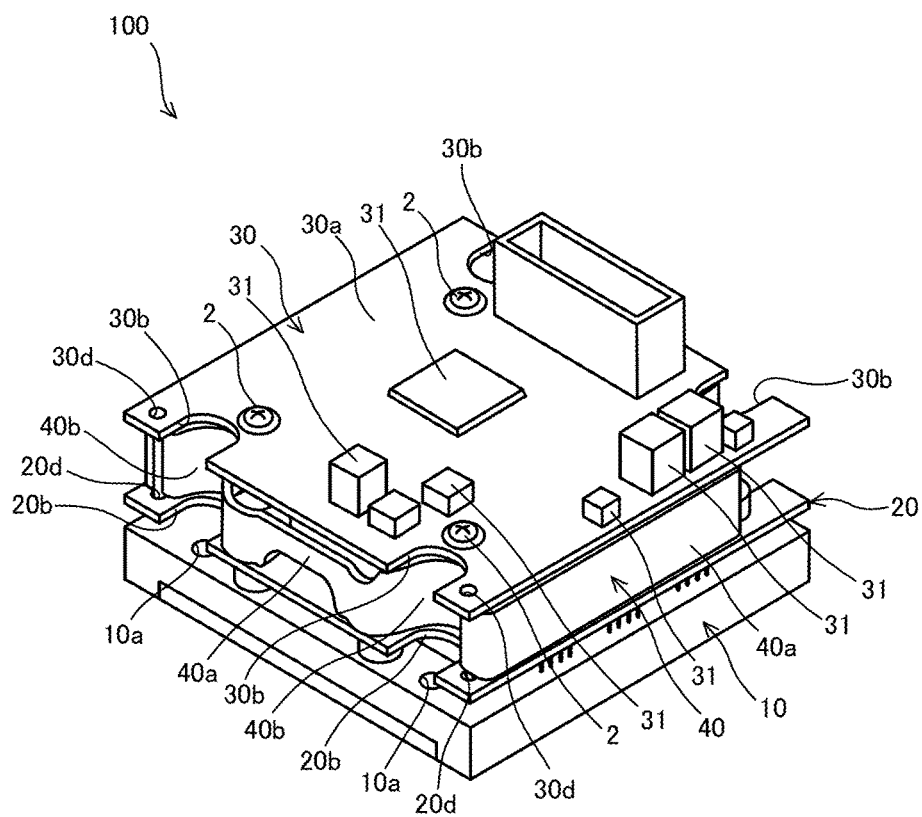
FIG. 1 is an external perspective view of an electronic control module according to an embodiment.
Figure 2:
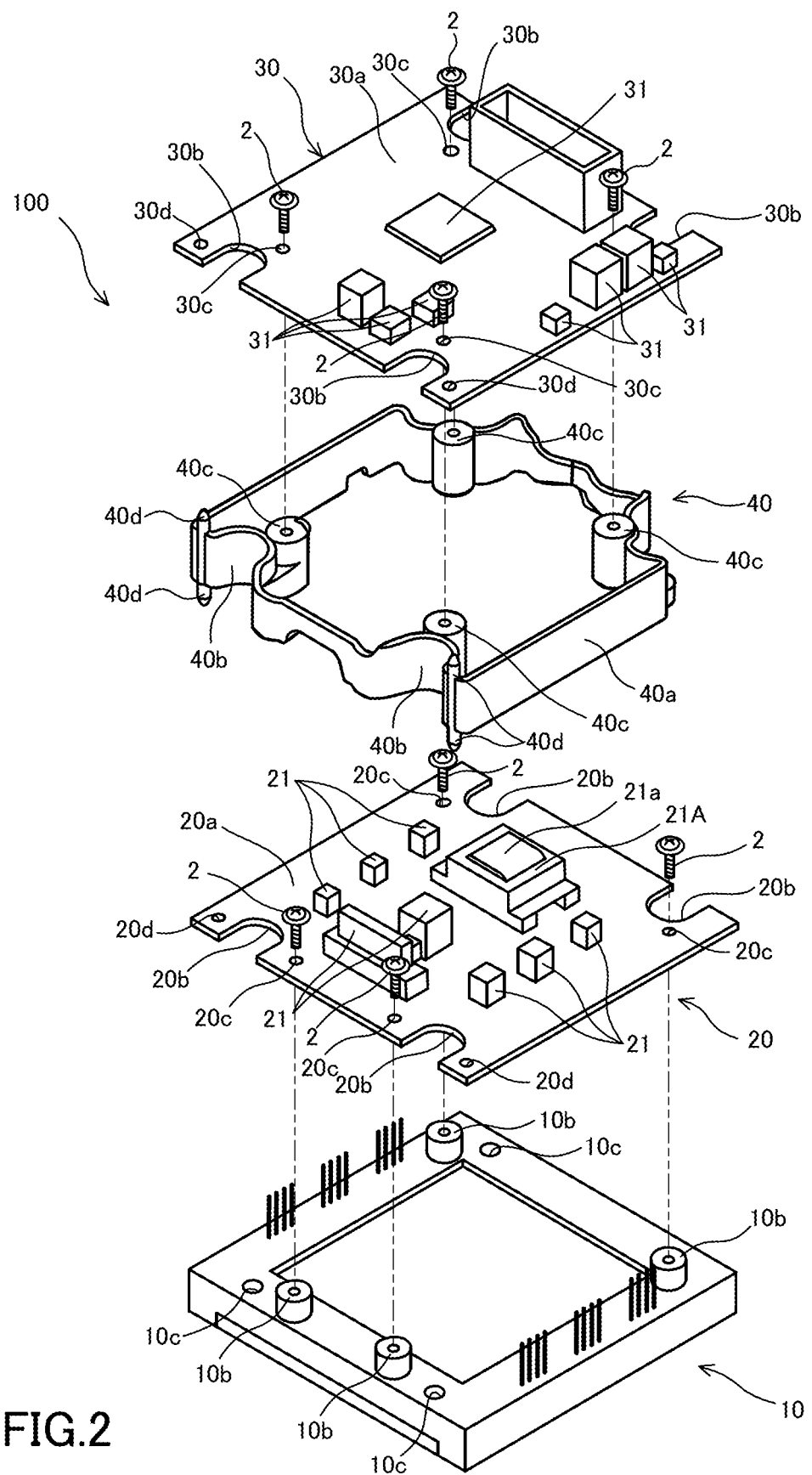
FIG. 2 is an exploded perspective view of the electronic control module according to the present embodiment.
Figure 3:
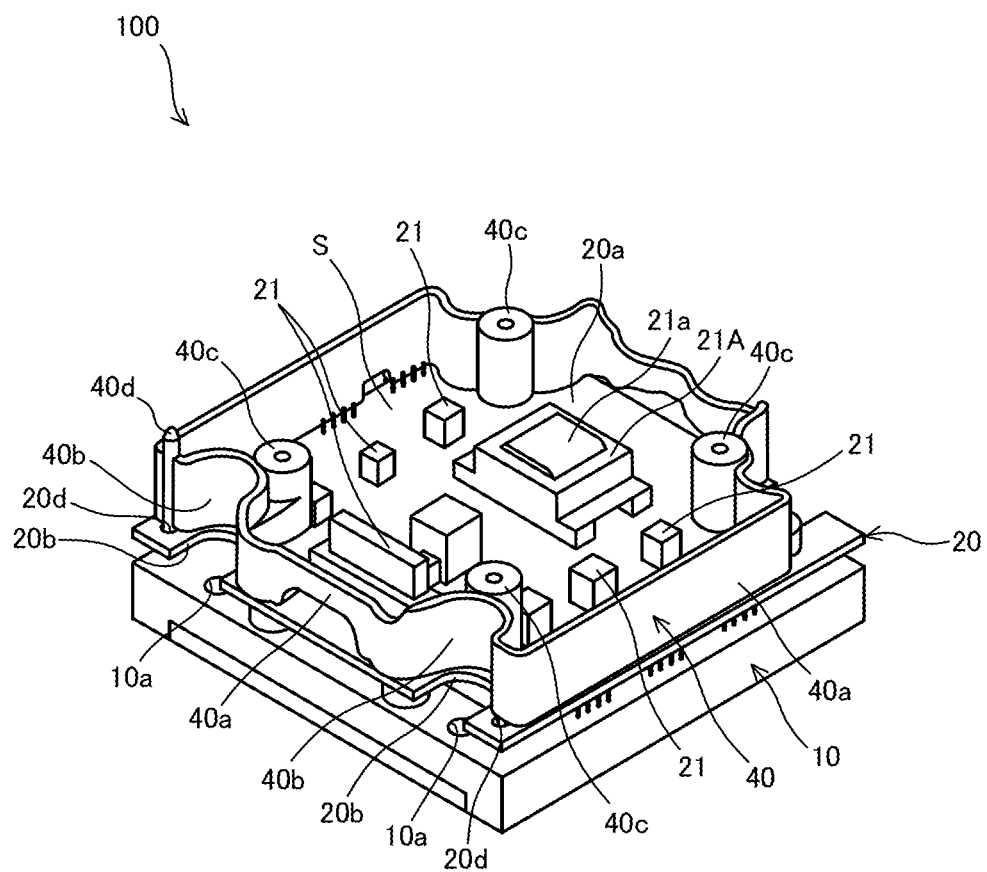
FIG. 3 is a view showing the inside of a closed space in the electronic control module according to the present embodiment.
Figure 4:
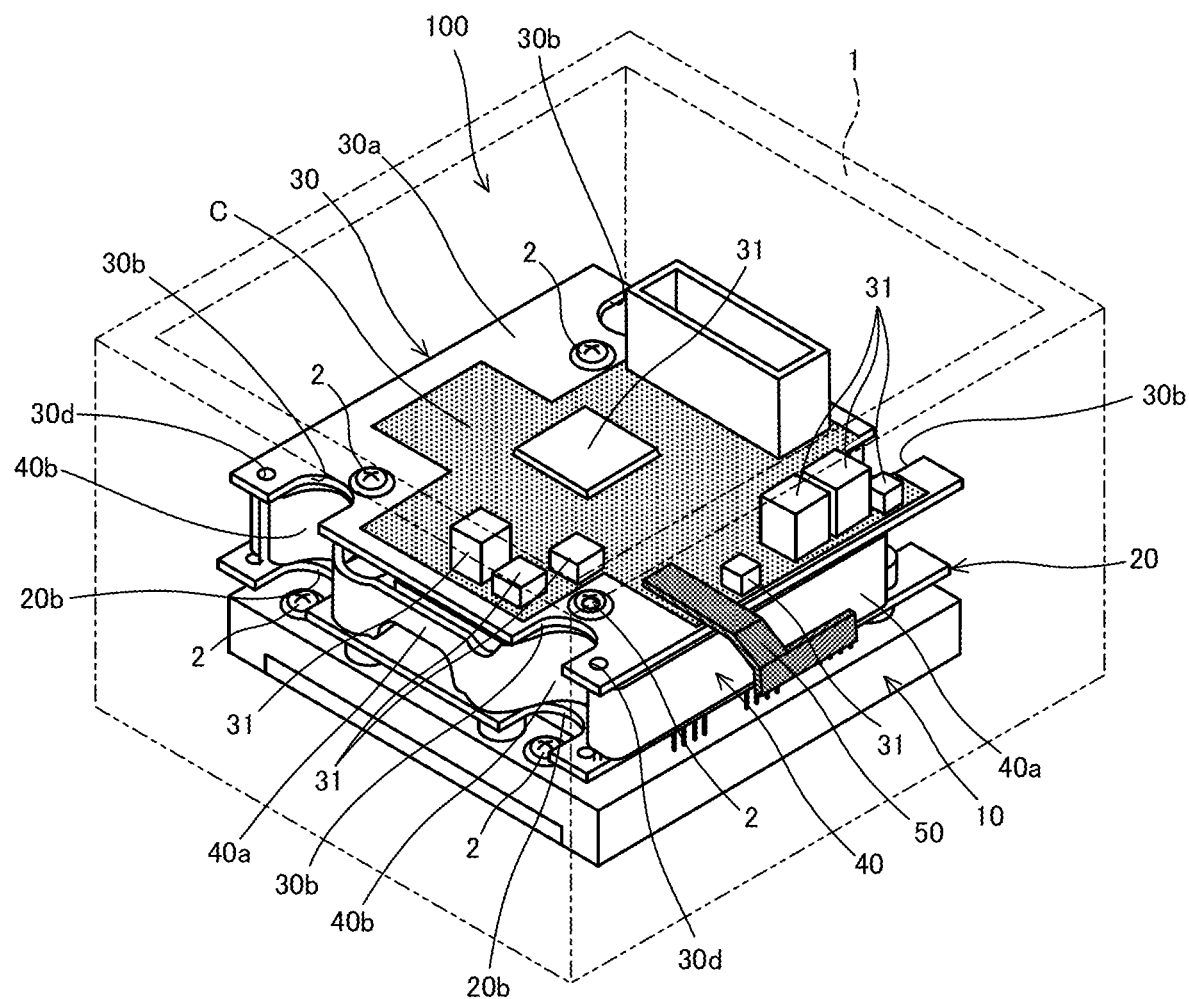
FIG. 4 is a view in which the electronic control module according to the present embodiment is attached to a housing.

FIG. 1 is an external perspective view of an electronic control module 100 according to the present embodiment. FIG. 2 is an exploded perspective view of the electronic control module 100 according to the present embodiment. FIG. 3 is a view showing the inside of a closed space in the electronic control module 100 according to the present embodiment. FIG. 4 is a view in which the electronic control module 100 according to the present embodiment is attached to a housing 1. Upper and lower parts in the following description do not mean top and bottom parts, but mean upper and lower parts in the drawings.

The electronic control module 100 according to the present embodiment is used, for example, in a power control unit of a hybrid vehicle. As shown in FIGS. 1 and 2, the electronic control module 100 includes: a power module 10 as a base body; a driver board 20 as a first board disposed on the power module 10 and having an upper surface 20a on which electronic components 21 are mounted; a motor control board 30 as a second board disposed on an upper surface 20a side of the driver board 20 with an interval therebetween and having an upper surface 30a on which electronic components 31 are mounted; and a tubular bracket 40 provided between the driver board 20 and the motor control board 30.

The electronic control module 100 is fixed to a bottom surface of a metal housing 1 by screws 2, and is accommodated in the housing 1 (see FIG. 4).

The power module 10 includes an inverter (not shown) that converts DC power supplied from a battery mounted on the vehicle into multi-phase AC power. The power module 10 supplies the multi-phase AC power converted by the inverter to a motor generator (not shown).

The driver board 20 controls a switching operation of the power module 10. As shown in FIGS. 2 and 3, a plurality of electronic components 21 (a transformer, a diode, a capacitor, a chip resistor, and the like) are disposed on the upper surface 20a of the driver board 20. These electronic components 21 constitute a switching circuit.

In the vicinity of both ends of each of two opposing sides of the driver board 20, notches 20b are provided to prevent the screws 2 that fix the electronic control module 100 to the housing 1 and a tool that fastens the screws 2 from coming into contact with the driver board 20.

The driver board 20 is further provided with through holes 20c into which the screws 2 that fix the driver board 20 to the power module 10 are inserted, and through holes 20d into which positioning protrusions 40d (see FIG. 2) provided on the bracket 40 are inserted.

The motor control board 30 controls an operation of the switching circuit provided on the driver board 20 according to a vehicle driving state. A plurality of electronic components 31 (a CPU, a power supply IC, a diode, a capacitor, a chip resistor, and the like) are disposed on the upper surface 30a of the motor control board 30. The electronic components 31 constitute a control circuit that controls a frequency of a switching operation in the switching circuit provided on the driver board 20.

In the vicinity of both ends of each of two opposing sides of the motor control board 30, notches 30b are provided to prevent the screws 2 that fix the electronic control module 100 to the housing 1 and a tool that fastens the screws 2 from coming into contact with the motor control board 30.

The motor control board 30 is further provided with through holes 30c into which the screws 2 that fix the motor control board 30 to the bracket 40 are inserted, and through holes 30d into which positioning protrusions 40d provided on the bracket 40 are inserted.

The bracket 40 is formed of a resin material (for example, polyphenylene sulfide resin (PPS resin), PBT resin). The bracket 40 is formed as a tubular frame body along a shape of an outer edge portion of the driver board 20.

In the vicinity of both ends of each of two opposing sides of the bracket 40, recesses 40b are provided to prevent the screws 2 that fix the electronic control module 100 to the housing 1 and a tool that fastens the screws 2 from coming into contact with the electronic components 21 and the like disposed on the driver board 20. The recesses 40b are formed such that a peripheral wall 40a is recessed inward.

The bracket 40 is further provided with receiving portions 40c into which the screws 2 that fix the motor control board 30 to the bracket 40 are screwed. The receiving portions 40c are adjacent to inner sides of the recesses 40b.

Next, the assembly of the electronic control module 100 will be described.

The driver board 20 is mounted on the power module 10, and the screws 2 inserted through the through holes 20c are screwed into protrusions 10b provided on an upper surface of the power module 10. As a result, the driver board 20 is fixed on the power module 10.

Next, the bracket 40 is mounted on the driver board 20 such that the positioning protrusions 40d are inserted into the through holes 20d.

The motor control board 30 is mounted on the bracket 40 such that the positioning protrusions 40d provided on the bracket 40 are inserted into the through holes 30d. Thereafter, the screws 2 inserted into the through holes 30c of the motor control board 30 are screwed into the receiving portions 40b of the bracket 40, whereby the electronic control module 100 is completed.

The electronic control module 100 assembled in this manner is fixed to the housing 1 by screwing screws inserted into the through holes 10c of the power module 10 into the housing 1. At this time, the recesses 40b of the bracket 40 function as a guard for preventing a tool that fastens the screws from coming into contact with the driver board 20. Accordingly, it is possible to prevent the electronic components 21 on the driver board 20 from being damaged.

In the electronic control module 100, a closed space S is defined by the driver board 20, the motor control board 30, and the peripheral wall 40a of the bracket 40. In the electronic control module 100, as shown in FIG. 3, the electronic components 21 disposed on the driver board 20 are disposed inside the peripheral wall 40a of the bracket 40, that is, in the closed space S.

For example, when terminal intervals within the electronic components 21 and 31 themselves are narrow, a short circuit failure may occur due to adhesion of metal contamination generated by screwing or the like in assembly work. Therefore, the upper surfaces 20a and 30a of the driver board 20 and the motor control board 30 and surfaces of the electronic components 21 and 31 mounted on the driver board 20 and the motor control board 30 may be coated with an insulating coating agent.

However, for example, a surface of a coil component 21A such as a transformer cannot be generally coated. The reason is that when the surface is coated and the coating agent enters between wires of a winding portion 21a of the coil component 21A, the entering coating agent may repeat thermal expansion and thermal contraction in accordance with a change in ambient temperature and break the wires.

Therefore, in the present embodiment, the coil component 21A is disposed in the closed space S without being coated. Further, all of the electronic components 21 disposed on the driver board 20 are disposed in the closed space S. By disposing the electronic components 21 in the closed space S in this manner, it is possible to prevent contamination generated by a screwing operation or the like from adhering to the electronic components 21 or the driver board 20. Therefore, it is possible to prevent the occurrence of a short circuit failure even in a board including a component that cannot be coated.

Since the coil component 21A such as a transformer is not mounted on the motor control board 30, the upper surface 30a of the motor control board 30 and the surfaces of the electronic components 31 mounted on the motor control board 30 can be coated with an insulating coating agent.

Incidentally, for example, when an engine operates at a high rotation speed in an environment in which an ambient temperature is high, a temperature inside an engine room in which the electronic control module 100 is provided is high. In this state, for example, when a CPU or the like provided on the motor control board 30 performs calculations at a high frequency, a heat generation amount increases, and the heat may cause a failure in the electronic components 31 and the like.

Therefore, when the motor control board 30 is coated as described above, a coating agent (for example, an epoxy-based coating agent) having high thermal conductivity is used. Further, as shown in FIG. 4, a plate 50 having excellent thermal conductivity is provided between a coating portion C and the housing 1. Specifically, the plate 50 may be provided such that one end is in contact with the coating portion C and the other end is in contact with an inner wall of the housing 1. Accordingly, heat generated on the motor control board 30 can be released to the housing 1 through the plate 50. The plate 50 is formed in a flat plate shape by a metal having excellent thermal conductivity, such as aluminum, copper, or silver, or a resin having excellent thermal conductivity, such as PPS or polybutylene terephthalate resin (PBT).

According to the electronic control module 100 configured as described above, the following effects are exerted.

In the electronic control module 100, the electronic components 21 disposed on the driver board 20 are disposed in the closed space S defined by the driver board 20, the motor control board 30, and the bracket 40. Accordingly, since it is possible to prevent contamination from adhering to the electronic components 21, it is not necessary to apply an insulating coating to the driver board 20. Therefore, a cost can be reduced. Further, since the coil component 21A that cannot be coated is disposed in the closed space S, it is not necessary to take special measures against contamination of the coil component 21A, and it is not necessary to apply a coating to a region in the closed space S. Therefore, an increase in cost can be suppressed.

By providing the plate 50 having thermal conductivity between the coating portion C and the housing 1, the heat generated on the motor control board 30 can be released to the housing 1. Therefore, a failure or the like due to heat of the electronic components 31 can be suppressed.

In the above-described embodiment, an example in which the electronic control module 100 is used in a power control unit of a hybrid vehicle is described, but the electronic control module 100 is not limited thereto, and any electronic control module may be used as long as at least two electronic control boards are stacked in a vertical direction.

In the above-described embodiment, a case in which the coil component 21A (transformer) is mounted on the first board (the driver board 20) is described as an example, and a board on which the coil component 21A (transformer) is not mounted can also be applied.

In the above-described embodiment, a case in which the upper surface 30a of the motor control board 30 and all surfaces of the electronic components 31 mounted on the motor control board 30 are coated is described as an example. Alternatively, when an interval between conductive portions is secured to be equal to or more than a certain interval (for example, 3.5 mm or more), a short circuit failure does not occur even when contamination adheres. Therefore, in this case, the coating may not be applied to a portion where the interval between the conductive portions is equal to or more than the certain interval.

A configuration, an operation, and an effect of the embodiment of the present invention configured as described above will be collectively described.

The electronic control module 100 includes: a first board (driver board 20) having the upper surface 20a on which electronic components 21 are mounted; a second board (motor control board 30) disposed on the upper surface 20a side of the first board (driver board 20) with an interval therebetween and having the upper surface 30a on which electronic components 31 are mounted; and a tubular bracket 40 provided between the first board (driver board 20) and the second board (motor control board 30) and defining the closed space S between the first board (driver board 20) and the second board (motor control board 30).

By disposing the electronic components 21 mounted on the first board (driver board 20) in the closed space S, adhesion of contamination can be prevented. Since it is not necessary to apply the coating to the region in the closed space S, the cost can be reduced.

In the electronic control module 100, the electronic components 21 mounted on the first board (the driver board 20) include the coil component 21A.

The coil component 21A (for example, a transformer) cannot be coated. Therefore, by disposing the coil component 21A (for example, a transformer) in the closed space S, adhesion of contamination can be prevented without coating.

In the electronic control module 100, the upper surface 30a of the second board (motor control board 30) and surfaces of the electronic components 31 mounted on the second board (motor control board 30) are coated with an insulating coating agent.

By coating the upper surface 30a of the second board (motor control board 30) and the surfaces of the electronic components 31 mounted on the second board (motor control board 30) with the insulating coating agent, even when contamination adheres to the upper surface 30a of the second board (motor control board 30) and the surfaces of the electronic components 31, a short circuit failure can be prevented from occurring.

The electronic control module 100 includes the plate 50 that conducts heat between the coating portion C coated with the insulating coating agent and the housing 1 accommodating the electronic control module 100.

By providing the plate 50 having thermal conductivity between the coating portion C coated with the insulating coating agent and the housing 1 accommodating the electronic control module 100, heat generated on the second board (motor control board 30) can be released to the housing 1. Therefore, a failure due to the heat of the electronic components 31 can be suppressed.

Although the embodiment of the present invention is described above, the above-mentioned embodiment is merely a part of application examples of the present invention, and does not mean that the technical scope of the present invention is limited to the specific configurations of the above-mentioned embodiment.

In the above embodiment, a case in which the bracket 40 is formed in a tubular shape along the shape of the outer edge portion of the driver board 20 is described as an example, and the bracket 40 does not need to be formed in a shape along the shape of the outer edge portion, and may be formed in any shape as long as the closed space S can be defined at a necessary position.

The invention claimed is:

1. An assembly comprising:
an electronic control module comprising:
a first board having an upper surface on which electronic components are mounted;
a second board disposed on the upper surface side of the first board with an interval therebetween and having an upper surface on which electronic components are mounted; and
a tubular bracket provided between the first board and the second board and defining a closed space between the first board and the second board; and
a housing accommodating the electronic control module, wherein:
the electronic components mounted on the first board include a coil component;
the upper surface of the second board and surfaces of the electronic components mounted on the second board are coated with an insulating coating agent;
the coil component is not coated with any coating agent;
a first portion of the insulating coating agent is disposed on the surfaces of the electronic components mounted on the second board;
a second portion of the insulating coating agent is disposed on the upper surface of the second board; and
the electronic control module further comprises a plate that contacts the second portion of the insulating coating agent and an inner surface of a wall of the housing to conduct heat between the second portion of the insulating coating agent and the housing.

2. The assembly of claim 1, wherein:
the wall of the housing is a lateral wall of the housing; and
a portion of the plate contacting the second portion of the insulating coating agent extends in a lateral direction.

3. The assembly of claim 1, wherein:
a first portion of the plate extends in a first direction; and
a second portion of the plate extends in a second direction, the second direction substantially perpendicular to the first direction.

4. The assembly of claim 3, wherein:
the first portion of the plate contacts the second portion of the insulating coating agent; and
the second portion of the plate contacts the inner surface of the wall of the housing.

* * * * *